(12) United States Patent
Osumi et al.

(10) Patent No.: US 8,581,571 B2
(45) Date of Patent: Nov. 12, 2013

(54) MEASURING APPARATUS, TESTING APPARATUS AND MEASURING METHOD

(75) Inventors: Taro Osumi, Gunma (JP); Yutaka Ueki, Saitama (JP)

(73) Assignee: Advantest Corporation, Tokyo (JP)

( * ) Notice: Subject to any disclaimer, the term of this patent is extended or adjusted under 35 U.S.C. 154(b) by 673 days.

(21) Appl. No.: 12/703,925

(22) Filed: Feb. 11, 2010

(65) Prior Publication Data
US 2010/0213924 A1  Aug. 26, 2010

(30) Foreign Application Priority Data

Aug. 15, 2007  (JP) ................................. 2007-211864

(51) Int. Cl.
*G01R 23/165* (2006.01)

(52) U.S. Cl.
USPC ....................................................... 324/76.44

(58) Field of Classification Search
USPC ....................................................... 324/76.44
See application file for complete search history.

(56) References Cited

U.S. PATENT DOCUMENTS

| | | | | |
|---|---|---|---|---|
| 4,700,129 A | * | 10/1987 | Yoshizawa et al. | 324/76.77 |
| 4,939,779 A | * | 7/1990 | Hitchcock | 380/208 |
| 7,492,216 B2 | * | 2/2009 | Kurimoto et al. | 327/553 |
| 8,050,397 B1 | * | 11/2011 | Read | 379/390.02 |
| 2002/0123869 A1 | * | 9/2002 | Koppl et al. | 703/4 |

FOREIGN PATENT DOCUMENTS

| | | |
|---|---|---|
| JP | 60-71969 A | 4/1985 |
| JP | 62042076 | 3/1987 |
| JP | 4-38477 A | 2/1992 |
| JP | 4-50543 Y2 | 11/1992 |
| JP | 7-333271 A | 12/1995 |
| JP | 11-326411 A | 11/1999 |

OTHER PUBLICATIONS

Narahashi et al., "Multitone Signal no Peak Tai Heikin Denryokuchi (PAPR) o Teigen suru Shoki Iso Settelho", "A New Phasing Scheme for Multitone Signal Systems to Reduce Peak-to-Average-Power Ratio (PAPR)", The Transactions of the Institute of Electronics, Information and Communication Engineers B-II, Tsushin II—Musen Tsushin-Musen Oyo, Nov. 25, 1995, vol. J78-B-2, No. 11, pp. 663 to 671.
International Search Report (ISR) issued in PCT/JP2008/064490 (parent application) for Examiner consideration.
Written Opinion (PCT/ISA/237) issued in PCT/JP2008/064490 (parent application).
JP Office Action/ Search Report and Computer Translation dated Nov. 13, 2012; Application No. 2009-528133.

* cited by examiner

*Primary Examiner* — Amy He

(57) ABSTRACT

Provided is a measurement apparatus that measures a characteristic of a filter, comprising a first transmission line that has the filter connected therein, the first transmission line receiving a multi-tone signal having signal components at a plurality of frequencies from an input end thereof, passing the multi-tone signal through the filter, and outputting the multi-tone signal from an output end thereof; a second transmission line that receives the multi-tone signal from an input end thereof, propagates the multi-tone signal therein, and outputs the multi-tone signal from an output end thereof; and a measuring section that calculates the characteristic of the filter based on the multi-tone signal output from the output end of the first transmission line and the multi-tone signal output from the output end of the second transmission line.

14 Claims, 9 Drawing Sheets

US 8,581,571 B2

MEASURING APPARATUS, TESTING APPARATUS AND MEASURING METHOD

CROSS REFERENCE TO RELATED APPLICATION

This is a continuation application of PCT/JP2008/064490 filed on Aug. 12, 2008 which claims priority from a Japanese Patent Application No. 2007-211864 filed on Aug. 15, 2007, the contents of which are incorporated herein by reference.

BACKGROUND

1. Technical Field

The present invention relates to a measurement apparatus, a test apparatus, and a measurement method. In particular, the present invention relates to a measurement apparatus, a test apparatus, and a measurement method for measuring characteristics of a filter.

2. Related Art

A group delay characteristic of a filter can be measured by a network analyzer, as in, for example, Japanese Patent Application Publication No. 7-333271.

When measuring the group delay characteristic of a filter using a network analyzer, however, the measurement takes a long time because the frequency of the measurement signal supplied to the filter must be swept. When performing a group delay characteristic test on a filter, the test apparatus must be provided with a network analyzer to measure the group delay of the filter. However, is it is difficult to provide a network analyzer, which is a large apparatus, inside the test apparatus.

SUMMARY

Therefore, it is an object of an aspect of the innovations herein to provide a measurement apparatus, a test apparatus, and a measurement method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may include a measurement apparatus that measures a characteristic of a filter, comprising a first transmission line that has the filter connected therein, the first transmission line receiving a multi-tone signal having signal components at a plurality of frequencies from an input end thereof, passing the multi-tone signal through the filter, and outputting the multi-tone signal from an output end thereof; a second transmission line that receives the multi-tone signal from an input end thereof, propagates the multi-tone signal therein, and outputs the multi-tone signal from an output end thereof; and a measuring section that calculates the characteristic of the filter based on the multi-tone signal output from the output end of the first transmission line and the multi-tone signal output from the output end of the second transmission line.

According to a second aspect related to the innovations herein, one exemplary test apparatus may include a test apparatus that tests a filter, comprising a performance board on which the filter is loaded; and a measuring section that calculates a characteristic of the filter. The performance board includes a first transmission line that has the filter connected therein, the first transmission line receiving a multi-tone signal having signal components at a plurality of frequencies from an input end thereof, passing the multi-tone signal through the filter, and outputting the multi-tone signal from an output end thereof; and a second transmission line that receives the multi-tone signal from an input end thereof, propagates the multi-tone signal therein, and outputs the multi-tone signal from an output end thereof. The measuring section calculates the characteristic of the filter based on the multi-tone signal output from the output end of the first transmission line and the multi-tone signal output from the output end of the second transmission line.

According to a third aspect related to the innovations herein, one exemplary measurement method may include a measurement method for measuring a characteristic of a filter, comprising inputting a multi-tone signal having signal components at a plurality of frequencies into an input end of a first transmission line in which the filter is connected; receiving the multi-tone signal passed through the filter from an output end of the first transmission line; inputting the multi-tone signal to an input end of a second transmission line; receiving the multi-tone signal propagated in the second transmission line from an output end of the second transmission line; and calculating the characteristic of the filter based on the multi-tone signal output from the output end of the first transmission line and the multi-tone signal output from the output end of the second transmission line.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
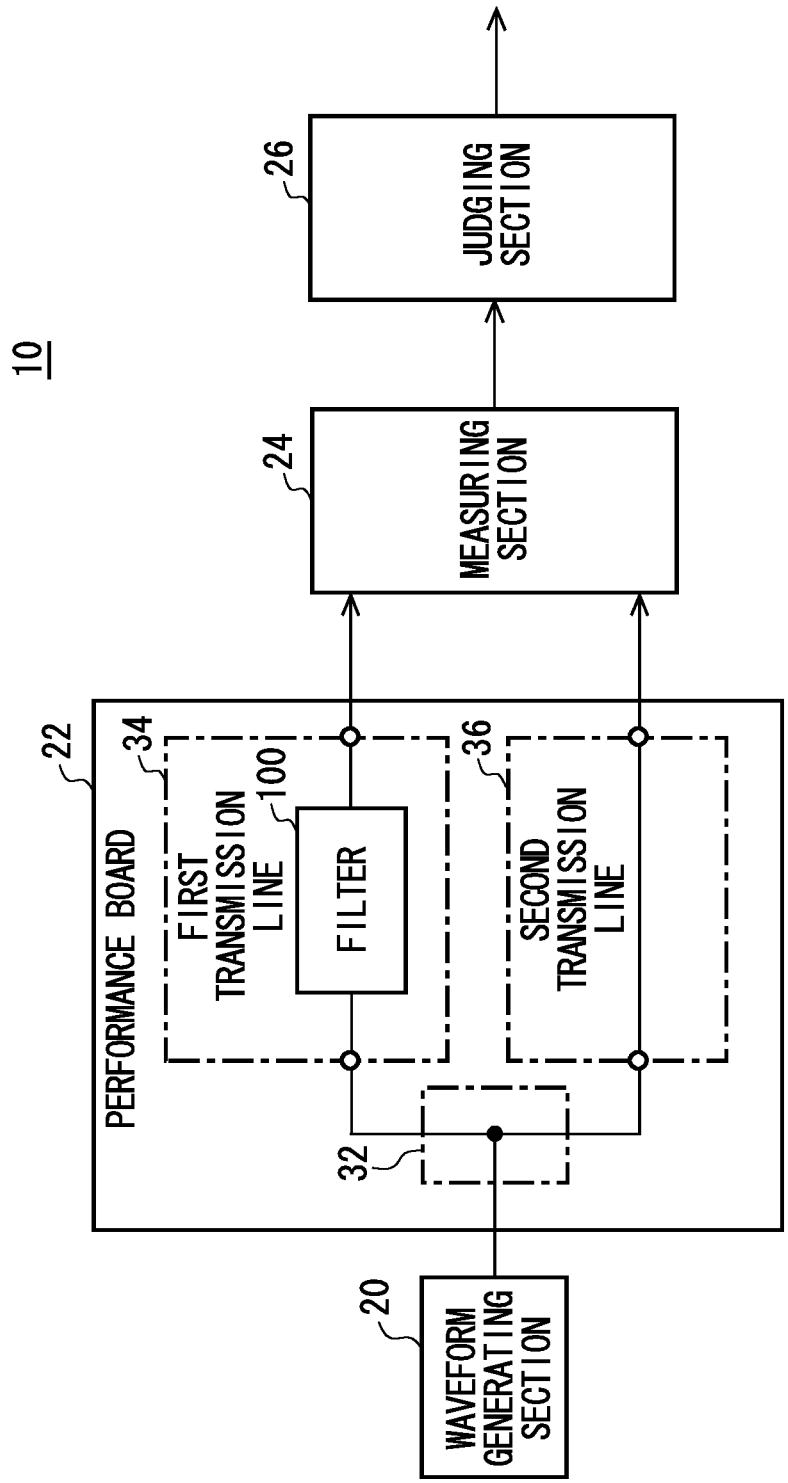
FIG. 1 shows a configuration of a test apparatus 10 according to an embodiment of the present invention, along with a filter 100.

FIG. 1 shows a configuration of a test apparatus 10 according to an embodiment of the present invention, along with a filter 100. The test apparatus 10 tests the filter 100. More specifically, the test apparatus 10 measures characteristics of the filter 100 and judges acceptability of the filter 100 by comparing the measurement result to an expected value. The filter 100, which is the test target, i.e. measurement target, may be a transmission path or an electronic circuit that transmits an input signal with a prescribed transfer characteristic, a portion of a circuit within an electronic device, or the like.

The test apparatus 10 includes a waveform generating section 20, a performance board 22, a measuring section 24, and a judging section 26. The waveform generating section 20 generates a multi-tone signal having signal components at a plurality of frequencies.

The filter 100 is loaded on the performance board 22. The performance board 22 includes a dividing section 32, a first transmission line 34, and a second transmission line 36. The dividing section 32 divides the multi-tone signal output from the waveform generating section 20 by a prescribed power ratio, such as 1/2. The dividing section 32 supplies the first transmission line 34 with one of the divided multi-tone signals, i.e. a first multi-tone signal, and provides the second transmission line 36 with the other divided multi-tone signal, i.e. a second multi-tone signal.

The filter 100 is connected in the first transmission line 34. The first transmission line 34 receives the first multi-tone signal at an input end thereof, passes the input first multi-tone signal through the filter 100, and outputs the resulting first multi-tone signal from an output end thereof. The second transmission line 36 receives the second multi-tone signal at an input end thereof, and propagates the second multi-tone signal to be output from an output end thereof.

Here, the path of the first transmission line 34, excluding the filter 100, and the path of the second transmission line 36 may each have substantially the same delay amount from the input end to the output end. As a result, in the test apparatus 10, the phase shift in the multi-tone signal caused by passage through the first transmission line 34, excluding the filter 100, is equal to the phase shift of the multi-tone signal caused by passage through the second transmission line 36.

The measuring section 24 calculates a characteristic of the filter 100 based on the multi-tone signal output from the output end of the first transmission line 34 and the multi-tone signal output from the output end of the second transmission line 36. For example, the measuring section 24 may calculate the group delay of the filter 100.

The judging section 26 judges acceptability of the filter 100 by comparing the characteristic of the filter 100 calculated by the measuring section 24 to an expected characteristic. For example, the judging section 26 may judge a characteristic of the filter 100 by comparing the group delay of the filter 100 calculated by the measuring section 24 to an expected group delay. The waveform generating section 20 may generate two multi-tone signals with identical waveforms and synchronized timings. In such a case, the performance board 22 includes, in place of the dividing section 32, a first input section that supplies the first transmission line 34 with one of the multi-tone signals, i.e. the first multi-tone signal, and a second input section that supplies the second transmission line 36 with the other multi-tone signal, i.e. the second multi-tone signal.

Figure 2:
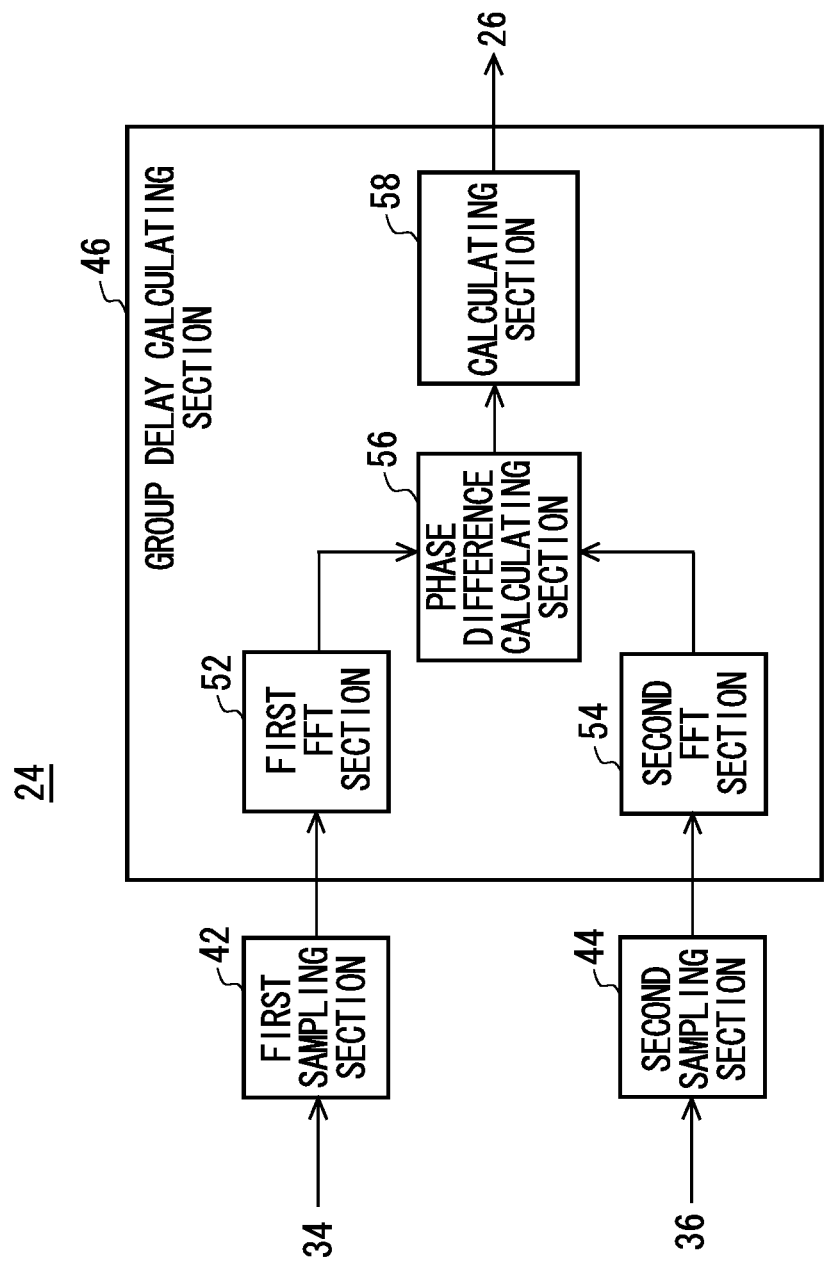
FIG. 2 shows an exemplary configuration of the measuring section 24 according to the present embodiment.

FIG. 2 shows an exemplary configuration of the measuring section 24 according to the present embodiment. The measuring section 24 may include a first sampling section 42, a second sampling section 44, and a group delay calculating section 46, and may calculate the group delay of the filter 100.

The first sampling section 42 samples the multi-tone signal passed through the filter 100 and output from an output end of the first transmission line 34. For example, the first sampling section 42 may sample and digitize the multi-tone signal passed through the filter 100 according to a prescribed clock.

The second sampling section 44 samples the multi-tone signal that is not passed through the filter 100 and that is output from the output end of the second transmission line 36. For example, the second sampling section 44 may sample and digitize the multi-tone signal not passed through the filter 100 according to a prescribed clock. The first sampling section 42 and the second sampling section 44 may sample the multi-tone signals using the same clock.

The group delay calculating section 46 calculates the group delay of the filter 100 based on a phase difference at each frequency between the first multi-tone signal sampled by the first sampling section 42 and the second multi-tone signal sampled by the second sampling section 44. More specifically, the group delay calculating section 46 calculates the negative derivative value, i.e. slope, of the phase difference at each frequency between the first multi-tone signal and the second multi-tone signal, and outputs the calculation result as the group delay of the filter 100.

The group delay calculating section 46 may include a first FFT section 52, a second FFT section 54, a phase difference calculating section 56, and a calculating section 58. The first FFT section 52 performs an FFT on the first multi-tone signal sampled by the first sampling section 42 to calculate the signal components, i.e. the real component (I-component) and the imaginary component (Q-component) at each frequency in the first multi-tone signal.

The second FFT section 54 performs an FFT on the second multi-tone signal sampled by the second sampling section 44 to calculate the signal components (I-component and Q-component) at each frequency in the second multi-tone signal. The first FFT section 52 and the second FFT section 54 perform the FFTs with the same operational conditions as each other, e.g. the same number of FFT points, and calculate signal components at the same frequencies. The first FFT section 52 and the second FFT section 54 may be realized by a single piece of hardware.

The phase difference calculating section 56 calculates, for each frequency, the phase difference between the signal components of the first multi-tone signal and the signal components of the second multi-tone signal. For example, the phase difference calculating section 56 may calculate, for each frequency, the product of (i) the signal components (I-component and Q-component) of the first multi-tone signal and (ii) the complex conjugate of the signal components (I-component and Q-component) of the second multi-tone signal, and output this product as the phase difference at each frequency. In other words, the phase difference calculating section 56 calculates, for each frequency, the product of (iii) the signal components of the multi-tone signal passed through the filter 100 and (iv) the complex conjugate of the signal components of the multi-tone signal not passed through the filter 100.

Here, the path of the first transmission line 34, excluding the filter 100, and the path of the second transmission line 36 have substantially the same delay amount. Therefore, the phase difference calculating section 56 can calculate the signal components (I-component and Q-component) at each frequency of the multi-tone signal that has a phase shift resulting from the filter 100, excluding the phase shift caused by the transmission path.

The calculating section 58 calculates the negative derivative value, i.e. slope, of the phase at each frequency, based on the signal components (I-component and Q-component) at each frequency output by the phase difference calculating section 56. The phase difference calculating section 56 then outputs, as the group delay of the filter 100, the calculated negative derivative value of the phase of the signal components at each frequency.

Here, the group delay GD(f) relative to frequency of the filter 100 can be obtained by dividing the phase θ(f) by the frequency f, as shown in Expression 1 below.

$$GD(f) = \frac{d\theta(f)}{2\pi df} \qquad (1)$$

The right side of Expression 1 can be transformed into Expression 2 below. Here, I(f) represents the real part of the signal component and Q(f) represents the imaginary part of the signal component.

$$= \frac{d\theta(f)}{dx} \frac{dx}{2\pi df} \cdots x = \frac{Q(f)}{I(f)} \qquad (2)$$

Expression 2 can be transformed to obtain Expression 3 below. Here, the derivative of $\tan^{-1}x$ is $1/(x^2+1)$, and so Expression 3 can be transformed into Expression 4.

$$= \frac{d\tan^{-1}x}{dx} \frac{dx}{2\pi df} \qquad (3)$$

$$= \frac{1}{x^2+1} \frac{dx}{2\pi df} \qquad (4)$$

By substituting Q(f)/I(f) for x, Expression 4 can be transformed into Expression 5.

$$= \frac{I^2(f)}{Q^2(f)+I^2(f)} \frac{1}{2\pi I^2(f)} \left( I(f)\frac{dQ(f)}{df} - Q(f)\frac{dI(f)}{df} \right) \qquad (5)$$

By re-expressing the portion of Expression 5 represented by the derivative as a subtraction formula of sample points, Expression 5 can be transformed into Expression 6. In Expression 6, n represents the sample number at an arbitrary frequency, i.e. the sample number at the frequency for which the group delay is being calculated, and $T_{sample}$ represents the inverse of the difference between the frequency of the sample number (n−1) and the frequency at the sample number n.

$$GD(n) = \frac{1}{2\pi(I^2(n)+Q^2(n))} \qquad (6)$$

$$(I(n)(Q(n-1)-Q(n-1))-$$

$$Q(n)(I(n+1)-I(n-1)))T_{sample}$$

$$T_{sample} = \frac{1}{df}$$

In other words, the group delay GD(n) at each frequency is expressed by Expression 6. Therefore, the phase difference calculating section 56 can calculate the group delay GD(n) by solving Expression 6 based on the signal components (I(n) and Q(n)) at each frequency n of the multi-tone signal from which the shift caused by the transmission line is removed.

Figure 3:
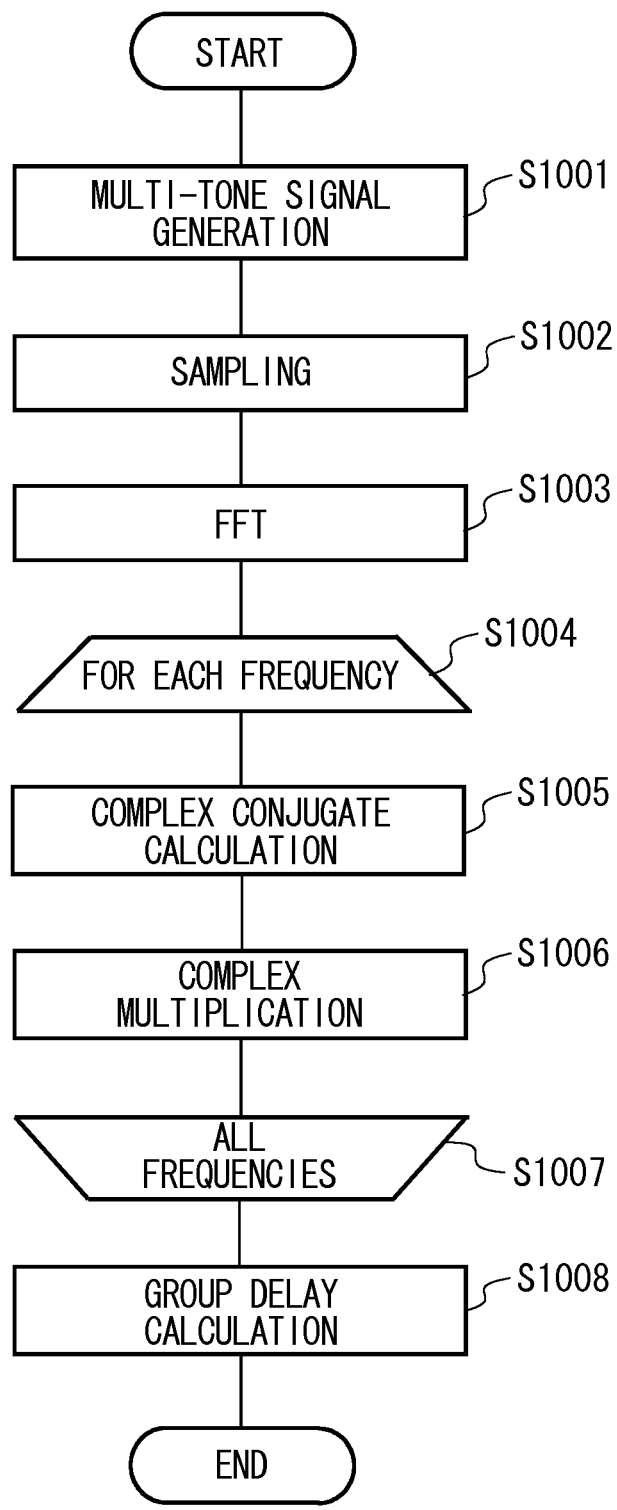
FIG. 3 shows a flow for calculating the group delay by the test apparatus 10 of the present embodiment.
Figure 4:
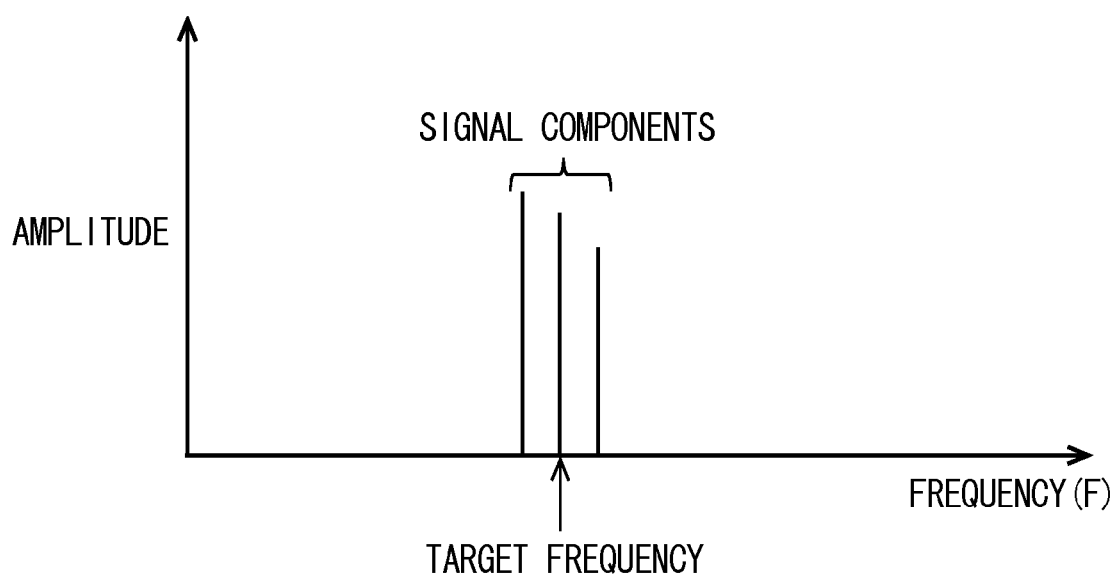
FIG. 4 shows exemplary signal components near an arbitrary measured frequency of the multi-tone signal output from the waveform generating section 20.

FIG. 3 shows a flow for calculating the group delay by the test apparatus 10 of the present embodiment. FIG. 4 shows exemplary signal components near an arbitrary measured frequency of the multi-tone signal output from the waveform generating section 20.

First, the waveform generating section 20 generates the multi-tone signal and passes the multi-tone signal through the first transmission line 34 and the second transmission line 36 (S1001). Here, the waveform generating section 20 generates, for each target frequency at which the group delay is to be measured, a multi-tone signal that has signal components at two or more frequencies surrounding the target frequency. For example, as shown in FIG. 4, the waveform generating section 20 may generate a multi-tone signal that includes a signal component at a frequency matching the target frequency and signal components at frequencies greater than and less than the target frequency. In this way, the waveform generating section 20 can generate a multi-tone signal that can measure the slope of the phase at the target frequency.

If the ratio of the peak power to the average power (PAPR) of the multi-tone signal generated by the waveform generating section 20 is large, it becomes difficult for the measuring section 24 to accurately measure the group delay of the filter 100. In other words, if the waveform generating section 20 generates a multi-tone signal in which the peak voltage is greater than the input range of the filter 100, the measuring section 24 cannot accurately measure the group delay because the signal passed through the filter 100 is distorted. On the other hand, lowering the peak voltage of a multi-tone signal with a large PAPR to be no greater than the input range of the filter 100 causes the average power of the signal passed by the filter 100 to decrease, and so the measuring section 24 cannot accurately measure the group delay due to the large dynamic range.

To solve this problem, the waveform generating section 20 may adjust the phase of the signal components of the multi-tone signal at each frequency such that the peak value is no greater than the input range of the filter 100 and the average power is no less than a predetermined value. For example, the waveform generating section 20 may generate a multi-tone signal whose initial phase is adjusted using the technique proposed in Non-Patent Document 1 (S. Narazaki, T. Nojima, "Setting Initial Phase of a Multi-tone Signal to Reduce the Peak to Average Power Ratio (PAPR)," Electronic Information Communication Society Publication, November 1995, No. 11, p. 663-671). The average power set to be no less than the predetermined value may be sufficiently greater than the noise level. As a result, both the distortion and the dynamic range of the multi-tone signal passed through the filter 100 are decreased, and so the waveform generating section 20 can accurately measure the characteristic of the filter 100.

Next, the first sampling section 42 samples the multi-tone signal passed through the filter 100 and output from the output end of the first transmission line 34 (S1002). In parallel to this processes, the second sampling section 44 samples the multi-tone signal that is not passed through the filter 100 and that is output from the output end of the second transmission line 36 (S1002).

Next, the first FFT section 52 performs an FFT on the multi-tone signal sampled by the first sampling section 42, and the second FFT section 54 performs an FFT on the multi-tone signal sampled by the second sampling section 44 (S1003).

The phase difference calculating section 56 then repeatedly performs the processes of steps S1005 and S1006 for each frequency of the signal components obtained as results of the FFTs (S1004, S1007). First, the phase difference calculating section 56 calculates the complex conjugate of the signal components of the multi-tone signal not passed through the filter 100, i.e. the multi-tone signal sampled by the second sampling section 44 (S1005). Next, the phase difference calculating section 56 performs complex multiplication of (i) the signal components of the multi-tone signal passed through the filter 100, i.e. the multi-tone signal sampled by the first sampling section 42, and (ii) the complex conjugate of the signal components of the multi-tone signal not passed through the filter 100 (S1006). After the phase difference calculating section 56 finishes steps S1005 and S1006 for all of the frequencies, the process moves to step S1008.

Next, the calculating section 58 calculates the negative derivative, i.e. slope, of the phase at each frequency based on the signal components (I-component and Q-component) calculated at each frequency in steps S1004 to S1007. The calculating section 58 outputs, as the group delay, the negative derivative value of the phase calculated at each frequency (S1008).

The test apparatus 10 described above need not measure the delay amount at each frequency by sweeping the frequency, and can therefore decrease the measurement time. Furthermore, the test apparatus 10 can measure the group delay without using a network analyzer, and can therefore be smaller.

Figure 5:
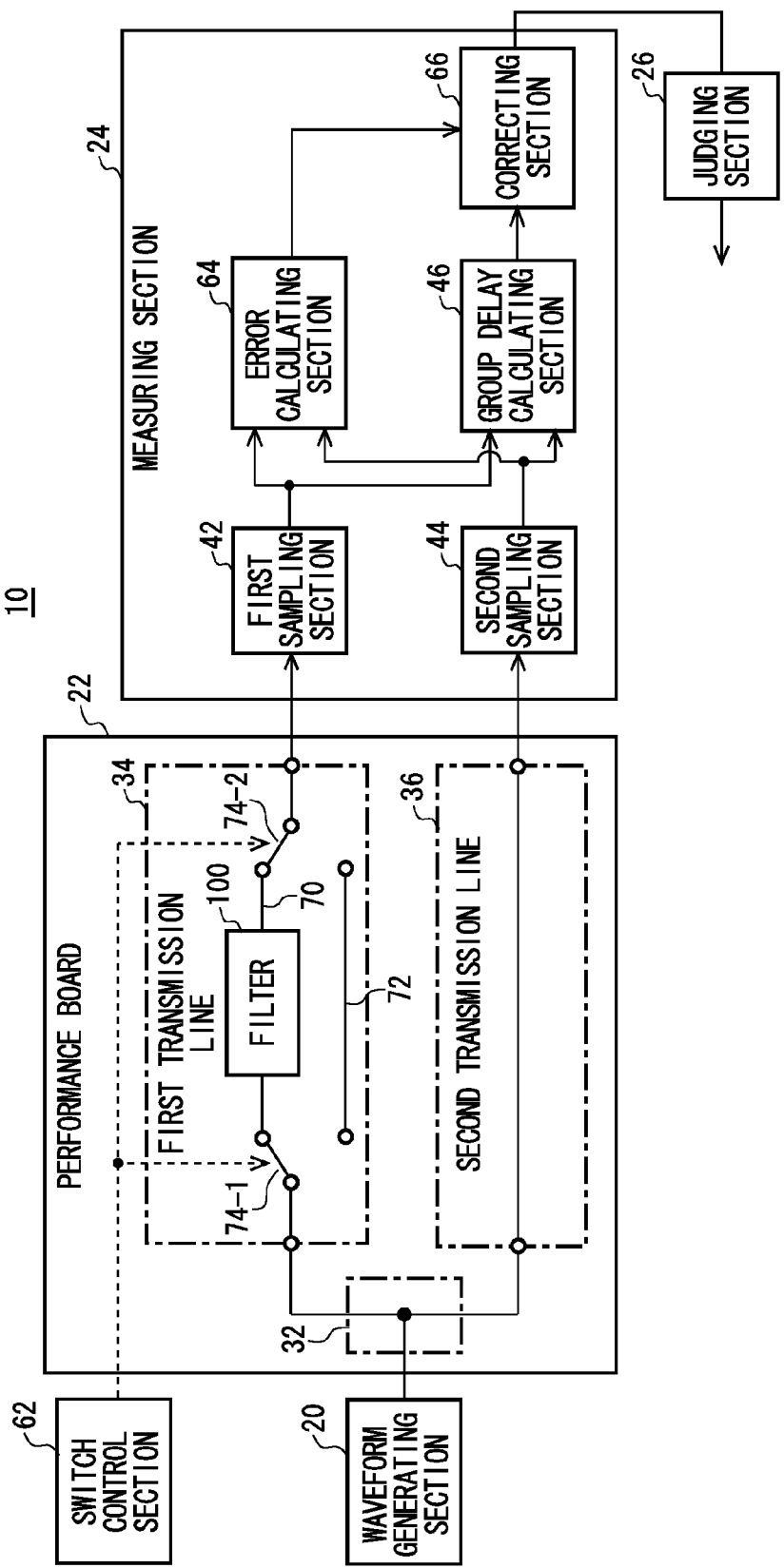
FIG. 5 shows a configuration of the test apparatus 10 according to a first modification of the present embodiment.

FIG. 5 shows a configuration of the test apparatus 10 according to a first modification of the present embodiment. The test apparatus 10 of the first modification shown in FIG. 5 has approximately the same function and configuration as the test apparatus 10 shown in FIG. 1, and therefore the following description includes only differing points.

Prior to measuring the characteristic of the filter 100, the test apparatus 10 performs a calibration. During calibration, the waveform generating section 20 generates an adjustment signal instead of the multi-tone signal. For example, the waveform generating section 20 may output an adjustment signal that is identical to the multi-tone signal output during characteristic measurement.

During calibration, the first transmission line 34 receives the adjustment signal at the input end and outputs the adjustment signal from the output end while bypassing the filter 100. During calibration, the second transmission line 36 receives the adjustment signal at the input end and outputs the adjustment signal from the output end.

The first transmission line 34 may include a first path 70, a second path 72, and first switches 74 (74-1 and 74-2). The first path 70 can have the filter 100 connected therein. During characteristic measurement, the first path 70 receives the multi-tone signal at the input end, passes the multi-tone signal through the filter 100, and outputs the multi-tone signal from the output end. During calibration, the second path 72 receives the adjustment signal at the input end and outputs the adjustment signal from the output end while bypassing the filter 100.

The first switches 74 (74-1 and 74-2) switch the transmission path running from the input end to the output end. More specifically, the first switches 74 connect the input and output ends to each other via the first path 70 during characteristic measurement, and connect the input and output ends to each other via the second path 72 during calibration. The test apparatus 10 may further include a switch control section 62 that controls the switching of the first switches 74.

The measuring section 24 further includes an error calculating section 64 and a correcting section 66. During calibration, the first sampling section 42 samples the adjustment signal that is output from the output end of the first transmission line 34 and that bypasses the filter 100. During calibration, the second sampling section 44 samples the adjustment signal that is not passed through the filter 100 and that is output from the output end of the second transmission line 36.

During calibration, the error calculating section 64 calculates the error in the delay amount between the second transmission line 36 and the first transmission line 34, excluding the filter 100, based on (i) the adjustment signal output from the output end of the second transmission line 36 and sampled by the second sampling section 44 and (ii) the adjustment signal output from the output end of the first transmission line 34 and sampled by the first sampling section 42. For example, the error calculating section 64 may calculate the negative derivative, i.e. slope, of the phase difference between the two sampled adjustment signals, and output the result as the error in the delay amount. The error calculating section 64 may perform the same calculation as the group delay calculating section 46 to calculate the error in the delay amount at each frequency.

During characteristic measurement of the filter 100, the correcting section 66 corrects the group delay calculated by the group delay calculating section 46, based on the error in the delay amount calculated by the error calculating section 64. For example, the correcting section 66 may correct the group delay calculated by the group delay calculating section 46 by adding the error calculated by the error calculating section 64 to the group delay calculated by the group delay calculating section 46, or by subtracting the error calculated by the error calculating section 64 from the group delay calculated by the group delay calculating section 46.

Figure 6:
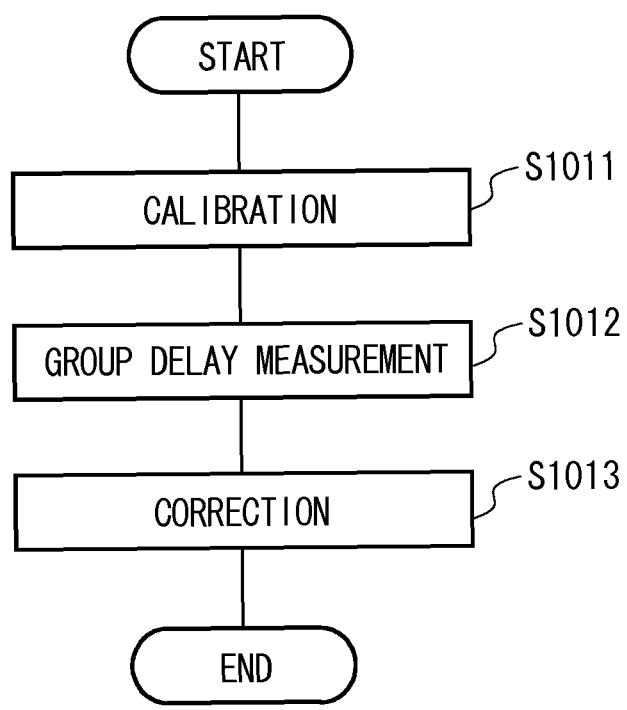
FIG. 6 shows a process flow of the test apparatus 10 according to the first modification.

FIG. 6 shows a process flow of the test apparatus 10 according to the first modification. First, the test apparatus 10 performs calibration (S1011). In this way, the test apparatus 10 can calculate the error between the delay amount of the second transmission line 36 and the delay amount of the first transmission line 34, excluding the filter 100.

Next, the test apparatus 10 measures the group delay of the filter 100 (S1012). Here, the test apparatus 10 performs the processes of steps S1001 to S1008 shown in FIG. 3.

Next, the test apparatus 10 corrects the group delay calculated at step S1012, based on the error calculated at step S1011 (S1013). As described above, even when there is an error between the path of the first transmission line 34, excluding the filter 100, and the path of the second transmission line 36, the test apparatus 10 according to the first modification can remove the effect of this error. As a result, the test apparatus 10 of the first modification can accurately measure the group delay of the filter 100.

Figure 7:
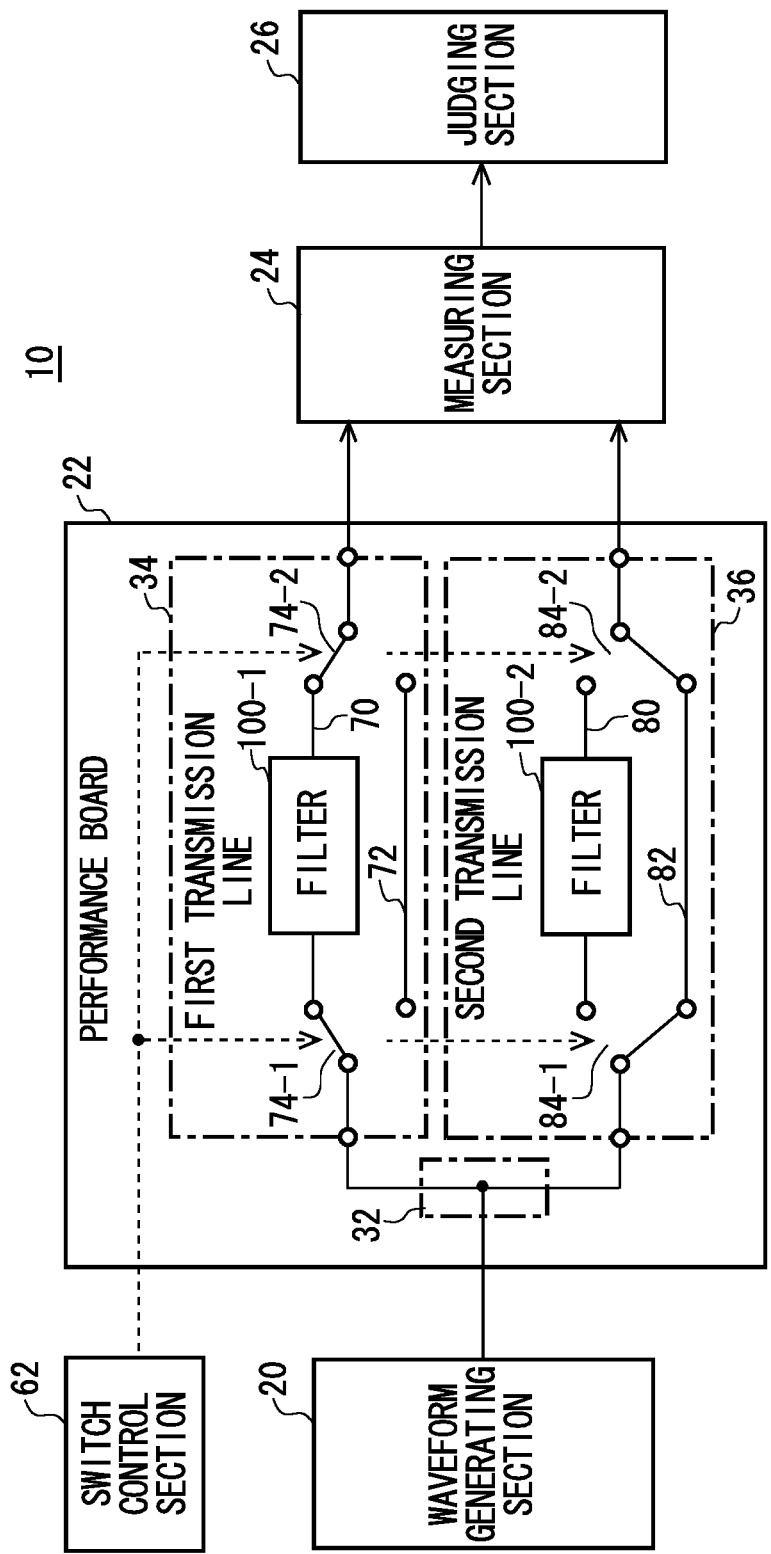
FIG. 7 shows a configuration of the test apparatus 10 according to a second modification of the present embodiment.

FIG. 7 shows a configuration of the test apparatus 10 according to a second modification of the present embodiment. The test apparatus 10 of the second embodiment shown in FIG. 7 adopts approximately the same function and configuration as the test apparatus 10 shown in FIG. 5, and therefore the following description includes only differing points.

The first transmission line 34 includes the first path 70, the second path 72, and the first switches 74 (74-1 and 74-2). A filter 100-1 can be connected in the first path 70. The first path 70 receives the multi-tone signal at the input end, passes the multi-tone signal through the filter 100-1, and outputs the multi-tone signal from the output end. The second path 72 receives the multi-tone signal at the input end and outputs the multi-tone signal from the output end while bypassing the filter 100-1. During a first measurement time that involves measuring the characteristic of the filter 100-1 connected in the first transmission line 34, the first switches 74 connect the input and output ends to each other via the first path 70. During a second measurement time that involves measuring the characteristic of a filter 100-2 connected in the second transmission line 36, the first switches 74 connect the input and output ends to each other via the second path 72.

The second transmission line 36 includes a third path 80, a fourth path 82, and second switches 84 (84-1 and 84-2). The third path 80 receives the multi-tone signal at the input end and outputs the multi-tone signal from the output end while bypassing the filter 100-2. The filter 100-2 can be connected in the fourth path 82. The fourth path 82 receives the multi-tone signal at the input end, passes the multi-tone signal through the filter 100-2, and outputs the multi-tone signal from the output end. During the first measurement time, the second switches 84 connect the input and output ends to each other via the third path 80. During the second measurement time, the second switches 84 connect the input and output ends to each other via the fourth path 82.

The switch control section 62 switches the first switches 74 and the second switches 84 in synchronization. During the first measurement time, the switch control section 62 switches the first switches 74 to output the multi-tone signal passed through the filter 100-1 from the output end of the first transmission line 34. In other words, when the switch control section 62 causes the multi-tone signal passed through the filter 100-1 to be output from the output end of the first transmission line 34 during the first measurement time, the switch control section 62 switches the second switches 84 to output the multi-tone signal bypassing the filter 100-2 from the output end of the second transmission line 36.

During the second measurement time, the switch control section 62 switches the first switches 74 to output the multi-tone signal bypassing the filter 100-1 from the output end of the first transmission line 34. In other words, when the switch control section 62 causes the multi-tone signal bypassing the filter 100-1 to be output from the output end of the first transmission line 34 during the second measurement time, the switch control section 62 outputs the multi-tone signal passing through the filter 100-2 from the output end of the second transmission line 36. The test apparatus 10 according to the second modification can use this switching operation to easily measure the characteristics of a filter 100, regardless of whether the filter 100 is connected in the first transmission line 34 or in the second transmission line 36.

Figure 8:
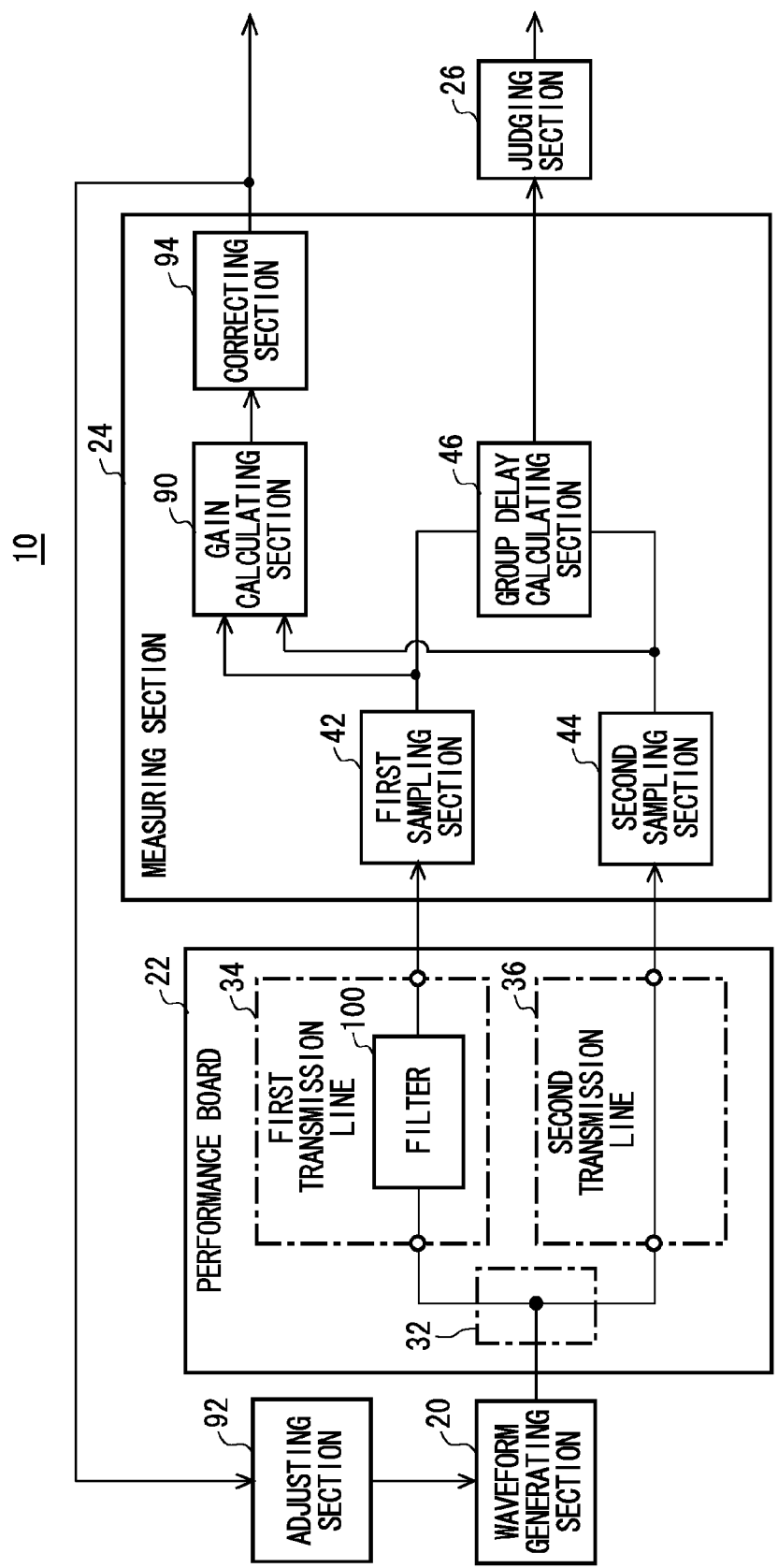
FIG. 8 shows a configuration of the test apparatus 10 according to a third modification of the present embodiment.

FIG. 8 shows a configuration of the test apparatus 10 according to a third modification of the present embodiment. The test apparatus 10 of the third modification shown in FIG. 8 has approximately the same function and configuration as the test apparatus 10 shown in FIG. 1, and therefore the following description includes only differing points.

The measuring section 24 of the third modification further includes a gain calculating section 90. The gain calculating section 90 calculates the gain of the filter 100 at each frequency based on the amplitude difference at each frequency between the multi-tone signal sampled by the first sampling section 42 and the multi-tone signal sampled by the second sampling section 44. More specifically, the gain calculating section 90 calculates the amplitude difference between the first multi-tone signal and the second multi-tone signal at each frequency, and outputs the results as the gain of the filter 100 at each frequency. In this way, the test apparatus 10 of the third embodiment can easily measure the gain of the filter 100.

Furthermore, the test apparatus 10 of the third modification may further include an adjusting section 92. The adjusting section 92 enables the waveform generating section 20 to generate a multi-tone signal in which the amplitudes of signal components at a plurality of frequencies are adjusted according to the gain of the filter 100 at the corresponding frequency.

The measuring section 24 of the test apparatus 10 according to the third embodiment may further include a correcting section 94. In such a case, the test apparatus 10 performs a process identical to the calibration described in FIG. 5 during calibration. Furthermore, during calibration, the test apparatus 10 calculates an error in the gain of the second transmission line 36 and the gain of the first transmission line 34, excluding the filter 100, based on the adjustment signal output from the output end of the second transmission line 36 and the adjustment signal output from the output end of the first transmission line 34. During characteristic measurement of the filter 100, the correcting section 94 corrects the gain calculated by the gain calculating section 90, based on the gain error calculated during calibration.

Figure 9:
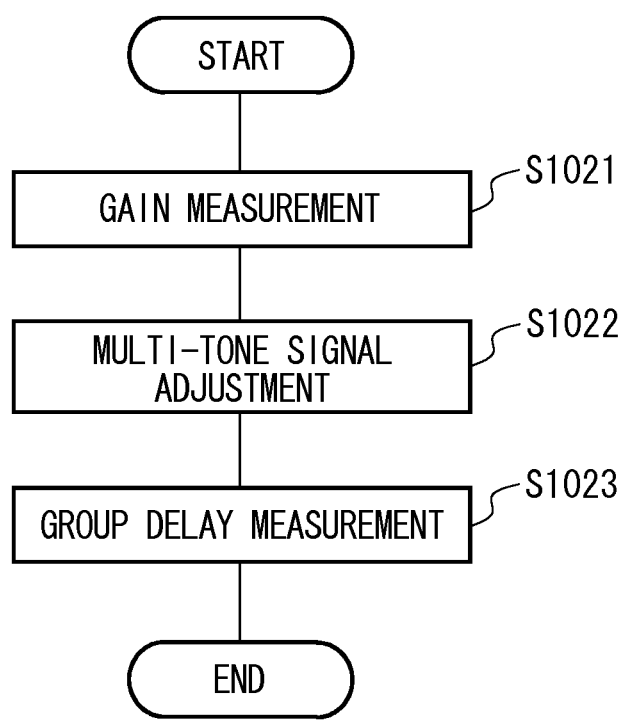
FIG. 9 shows a process flow of the test apparatus 10 according to the third embodiment.

FIG. 9 shows a process flow of the test apparatus 10 according to the third embodiment. First, the test apparatus 10 measures the gain of the filter 100 at each frequency (S1021). Next, the adjusting section 92 adjusts the multi-tone signal generated by the waveform generating section 20, based on the gain of the filter 100 at each frequency calculated in step S1021 (S1022).

For example, the adjusting section 92 may generate a multi-tone signal by holding constant, at each frequency, the amplitude of the multi-tone signal passed through the filter 100. For example, if the filter 100 has the characteristics of a low-pass filter, the adjusting section 92 causes the waveform generating section 20 to output a multi-tone signal in which the amplitude at high frequencies is increased in advance.

Next, the test apparatus 10 measures the group delay of the filter 100 (S1023). In this way, in the test apparatus 10 of the third modification, a signal whose amplitude is averaged in the high frequency regions, i.e. a signal with a small dynamic range, can be output from the filter 100. As a result, the test apparatus 10 can accurately measure the group delay of the filter 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures a characteristic of a filter, comprising:
   a first transmission line that has the filter connected therein, the first transmission line receiving a multi-tone signal having signal components at a plurality of frequencies from an input end thereof, passing the multi-tone signal through the filter, and outputting the multi-tone signal from an output end thereof;
   a second transmission line that receives the multi-tone signal from an input end thereof, propagates the multi-tone signal therein, and outputs the multi-tone signal from an output end thereof; and a measuring section that calculates the characteristic of the filter based on the multi-tone signal output from the output end of the first transmission line and the multi-tone signal output from the output end of the second transmission line, wherein the first transmission line includes:
a first path in which the filter is connected, the first path receiving the multi-tone signal from an input end thereof, passing the multi-tone signal through the filter, and outputting the multi-tone signal from an output end thereof; and
a second path that receives the multi-tone signal from an input end thereof and outputs the multi-tone signal from an output end thereof while bypassing the filter.

2. The measurement apparatus according to claim 1, wherein the measuring section includes:
a first sampling section that samples the multi-tone signal passed through the filter and output from the output end of the first transmission line;
a second sampling section that samples the multi-tone signal that is output from the output end of the second transmission line without being passed through the filter; and
a group delay calculating section that calculates a group delay of the filter based on phase difference, at each frequency, between the multi-tone signal sampled by the first sampling section and the multi-tone signal sampled by the second sampling section.

3. The measurement apparatus according to claim 2, wherein
the second path of the first transmission line and a path of the second transmission line each have substantially the same delay amount from the input end to the output end.

4. The measurement apparatus according to claim 2, further comprising a waveform generating section that adjusts the phase of each signal component of the multi-tone signal such that a peak value thereof is no greater than an input range of the filter and average power thereof is no less than a predetermined value.

5. The measurement apparatus according to claim 2, further comprising a waveform generating section that, during calibration, generates an adjustment signal, wherein
during calibration, the first transmission line receives the adjustment signal from the input end and outputs the adjustment signal from the output end via the second path,
during calibration, the second transmission line receives the adjustment signal from the input end and outputs the adjustment signal from the output end, and
the measurement apparatus further comprises:
an error calculating section that, during calibration, calculates an error between a delay amount of the second path of the first transmission line and a delay amount of the second transmission line, based on the adjustment signal output from the output end of the first transmission line and the adjustment signal output from the output end of the second transmission line; and
a correcting section that, during measurement of the characteristic of the filter, corrects the group delay calculated by the group delay calculating section based on the error between the delay amounts.

6. The measurement apparatus according to claim 2, wherein
the measuring section includes a gain calculating section that calculates gain of the filter at each frequency, based on an amplitude difference at each frequency between the multi-tone signal sampled by the first sampling section and the multi-tone signal sampled by the second sampling section.

7. The measurement apparatus according to claim 6, further comprising a waveform generating section that, during calibration, generates an adjustment signal, wherein
during calibration, the first transmission line receives the adjustment signal from the input end and outputs the adjustment signal from the output end via the second path,
during calibration, the second transmission line receives the adjustment signal from the input end and outputs the adjustment signal from the output end, and
the measurement apparatus further comprises:
an error calculating section that, during calibration, calculates an error between gain of the second path of the first transmission line and gain of the second transmission line, based on the adjustment signal output from the output end of the first transmission line and the adjustment signal output from the output end of the second transmission line; and
a correcting section that, during measurement of the characteristic of the filter, corrects the gain calculated by the gain calculating section based on the error between the gains.

8. The measurement apparatus according to claim 2, wherein
the measuring section includes a gain calculating section that calculates gain of the filter at each frequency, based on an amplitude difference at each frequency between the multi-tone signal sampled by the first sampling section and the multi-tone signal sampled by the second sampling section,
the measurement apparatus further comprises:
a waveform generating section that generates the multi-tone signal such that amplitude of each of the signal components at the plurality of frequencies in the multi-tone signal is adjusted according to gain of the filter at the corresponding frequency; and
an adjusting section that adjusts the multi-tone signal generated by the waveform generating section, based on the gain of the filter at each frequency calculated by the gain calculating section.

9. The measurement apparatus according to claim 1, wherein
the second transmission line includes:
a third path in which the filter is connected, the third path receiving the multi-tone signal from an input end thereof, passing the multi-tone signal through the filter, and outputting the multi-tone signal from an output end thereof; and
a fourth path that receives the multi-tone signal from an input end thereof and outputs the multi-tone signal from an output end thereof while bypassing the filter, and
the measurement apparatus further comprises a switch control section that (i) when the multi-tone signal passed through the filter is output from the output end of the first transmission line, outputs the multi-tone signal that bypasses the filter from the output end of the second transmission line and, (ii) when the multi-tone signal bypassing the filter is output from the output end of the first transmission line, outputs the multi-tone signal passed through the filter from the output end of the second transmission line.

10. The measurement apparatus according to claim 1, further comprising a waveform generating section that generates the multi-tone signal such that amplitude of each of the signal components at the plurality of frequencies in the multi-tone signal is adjusted according to gain of the filter at the corresponding frequency.

11. A test apparatus that tests a filter, comprising:
a performance board on which the filter is loaded; and
a measuring section that calculates a characteristic of the filter, wherein
the performance board includes;
  a first transmission line that has the filter connected therein, the first transmission line receiving a multi-tone signal having signal components at a plurality of frequencies from an input end thereof, passing the multi-tone signal through the filter, and outputting the multi-tone signal from an output end thereof; and
  a second transmission line that receives the multi-tone signal from an input end thereof, propagates the multi-tone signal therein, and outputs the multi-tone signal from an output end thereof,
the measuring section calculates the characteristic of the filter based on the multi-tone signal output from the output end of the first transmission line and the multi-tone signal output from the output end of the second transmission line, and
the first transmission line includes:
  a first path in which the filter is connected, the first path receiving the multi-tone signal from an input end thereof, passing the multi-tone signal through the filter, and outputting the multi-tone signal from an output end thereof; and
  a second path that receives the multi-tone signal from an input end thereof and outputs the multi-tone signal from an output end thereof while bypassing the filter.

12. The test apparatus according to claim 11, wherein the second transmission line includes:
  a third path in which the filter is connected, the third path receiving the multi-tone signal from an input end thereof, passing the multi-tone signal through the filter, and outputting the multi-tone signal from an output end thereof; and
  a fourth path that receives the multi-tone signal from an input end thereof and outputs the multi-tone signal from an output end thereof while bypassing the filter, and
the test apparatus further comprises a switch control section that (i) when the multi-tone signal passed through the filter is output from the output end of the first transmission line, outputs the multi-tone signal that bypasses the filter from the output end of the second transmission line and, (ii) when the multi-tone signal bypassing the filter is output from the output end of the first transmission line, outputs the multi-tone signal passed through the filter from the output end of the second transmission line.

13. A measurement method for measuring a characteristic of a filter, comprising:
  inputting a multi-tone signal having signal components at a plurality of frequencies into an input end of a first transmission line in which the filter is connected;
  receiving the multi-tone signal passed through the filter from an output end of the first transmission line;
  inputting the multi-tone signal to an input end of a second transmission line;
  receiving the multi-tone signal propagated in the second transmission line from an output end of the second transmission line; and
  calculating the characteristic of the filter based on the multi-tone signal output from the output end of the first transmission line and the multi-tone signal output from the output end of the second transmission line, wherein
the first transmission line includes:
  a first path in which the filter is connected, the first path operable to receive the multi-tone signal from an input end thereof, pass the multi-tone signal through the filter, and output the multi-tone signal from an output end thereof; and
  a second path operable to receive the multi-tone signal from an input end thereof and output the multi-tone signal from an output end thereof while bypassing the filter.

14. The measurement method according to claim 13, wherein
the second transmission line includes:
  a third path in which the filter is connected, the third path operable to receive the multi-tone signal from an input end thereof, pass the multi-tone signal through the filter, and output the multi-tone signal from an output end thereof; and
  a fourth path operable to receive the multi-tone signal from an input end thereof and output the multi-tone signal from an output end thereof while bypassing the filter, and
said receiving, the multi-tone signal propagated in the second transmission line from the output end of the second transmission line includes:
  receiving the multi-tone signal that bypasses the filter from the output end of the second transmission line when the multi-tone signal passed through the filter is output from the output end of the first transmission line; and
  outputting the multi-tone signal passed through the filter from the output end of the second transmission line when the multi-tone signal bypassing the filter is output from the output end of the first transmission line.

* * * * *